United States Patent
Nagamura et al.

(10) Patent No.: US 8,156,451 B2
(45) Date of Patent: Apr. 10, 2012

(54) METHOD OF MANUFACTURING PHOTOMASK

(75) Inventors: Yoshikazu Nagamura, Tokyo (JP); Shogo Narukawa, Tokyo (JP)

(73) Assignees: Renesas Electronics Corporation, Kawasaki-shi (JP); Dai Nippon Printing Co., Ltd., Tokyo (JP)

( * ) Notice: Subject to any disclaimer, the term of this patent is extended or adjusted under 35 U.S.C. 154(b) by 916 days.

(21) Appl. No.: 12/188,198

(22) Filed: Aug. 7, 2008

(65) Prior Publication Data

US 2009/0077524 A1   Mar. 19, 2009

(30) Foreign Application Priority Data

Sep. 14, 2007   (JP) ................ 2007-239303
Jul. 4, 2008    (JP) ................ 2008-175491

(51) Int. Cl.
*G06F 17/50*   (2006.01)
*G06F 19/00*   (2011.01)

(52) U.S. Cl. ............ 716/54; 716/56; 700/120; 700/121

(58) Field of Classification Search ............ 716/54, 716/56; 700/120–121
See application file for complete search history.

(56) References Cited

U.S. PATENT DOCUMENTS

| | | | |
|---|---|---|---|
| 5,777,901 A * | 7/1998 | Berezin et al. | 716/56 |
| 6,336,056 B1 * | 1/2002 | Fujimoto et al. | 700/121 |
| 6,374,398 B1 * | 4/2002 | Magee et al. | 716/56 |
| 6,507,930 B1 * | 1/2003 | Bass et al. | 716/54 |
| 7,480,539 B2 * | 1/2009 | Suttile et al. | 700/121 |
| 2004/0039584 A1 * | 2/2004 | Mori et al. | 705/1 |
| 2006/0122724 A1 * | 6/2006 | Croke et al. | 700/121 |
| 2006/0273266 A1 * | 12/2006 | Preil et al. | 250/548 |
| 2007/0026322 A1 * | 2/2007 | Yang | 430/5 |
| 2008/0046846 A1 * | 2/2008 | Chew et al. | 716/2 |
| 2008/0127028 A1 * | 5/2008 | Rittman | 716/19 |
| 2008/0148195 A1 * | 6/2008 | Chan et al. | 716/2 |
| 2008/0148216 A1 * | 6/2008 | Chan et al. | 716/19 |
| 2008/0163140 A1 * | 7/2008 | Fouquet et al. | 716/4 |
| 2008/0163141 A1 * | 7/2008 | Scheffer et al. | 716/5 |

* cited by examiner

*Primary Examiner* — Stacy Whitmore

(74) *Attorney, Agent, or Firm* — Miles & Stockbridge P.C.

(57) ABSTRACT

A technique for quantitatively expressing a manufacturing difficulty level of a photomask and for efficiently manufacturing the photomask is provided. A mask manufacturing difficulty level different for each mask layout, product, and mask layer is relatively recognized with a mask manufacturing load index calculated by a mask manufacturing load prediction system, and when layout correction is possible, the final layout is corrected to a layout with a low difficulty level, and a mask ordering party provides a mask manufacturer with information regarding the mask manufacturing difficulty level in an early stage. The mask manufacturing load index is expressed with a defect guarantee load index and a lithography load index.

2 Claims, 10 Drawing Sheets

METHOD OF MANUFACTURING PHOTOMASK

CROSS-REFERENCE TO RELATED APPLICATION

The present application claims priorities from Japanese Patent Application No. JP 2007-239303 filed on Sep. 14, 2007, and Japanese Patent Application No. JP 2008-175491 filed on Jul. 4, 2008, the contents of which are hereby incorporated by reference into this application.

TECHNICAL FIELD OF THE INVENTION

The present invention relates to a manufacturing technique of a photomask. More particularly, the present invention relates to a technique effective for improving efficiency of manufacturing masks.

BACKGROUND OF THE INVENTION

In recent years, an effort has been undertaken to improve a resolution performance on semiconductor wafers (hereinafter, simply referred to as wafer) so as to develop more advanced semiconductor devices with a continuous attempt for a finer design (circuit pattern) size and RET (Resolution Enhancement Technique). Therefore, photomasks also have introduced finer design rules, higher integration, more complex OPC (Optical Proximity Correction), etc. of circuit patterns (size) to be formed, making photomask manufacturing more difficult. It is because, in addition to that finer circuit pattern sizes improve the degree of integration of circuit patterns for increasing the number of circuit patterns within a photomask layout (the number of figures), adoption of advanced RET such as highly precise OPC, an auxiliary pattern, etc. increases the complexity of the circuit patterns.

Generally, when the difficulty of manufacturing (hereinafter, referred to as manufacturing difficulty level) is high, a manufacturing cost will be increased, and the price of photomasks will be raised in the case of manufacturing photomasks. Among all other semiconductor devices, the production of SoC (System on Chip) products in small lot and a large number of products has a proportion of the photomask cost to the profit higher than that of memory products, thus resulting in higher total order cost of the photomask; therefore, cost management of photomask is very important. To reduce the cost of photomask, photomask manufacturers' efforts to lower the cost and cooperation of ordering parties of the photomask are essential. The photomask manufacturers have improved manufacturing yields and optimized manufacturing processes for higher efficiency, and the ordering parties of the photomasks have studied and introduced optimization of specifications of photomask such as size specification and defect specification, and introduction of effective and rational pass/fail determination methods of photomasks.

SUMMARY OF THE INVENTION

Recently, introduction of the mask layout premising easiness of manufacturing, relaxation of standard with a specification setting per area on a photomask, and formation of designs (mask layouts) for increasing the efficiency of manufacturing photomasks that satisfy these conditions, i.e., the mask DFM (Design For Manufacturing) has been getting more important. Introduction of the mask DFM reliably can surely reduce the difficulty of photomask manufacturing. The mask DFM is used in various stages of mask layout creation, but has a problem that judgment of their effects on the overall efficiency promotion in photomask manufacturing is difficult. Therefore, unless the feedback obtained by reducing the cost, which is one of the indicators of effects of efficiency promotion of the photomask manufacturing, is clear, effort for mask DFM cannot be further introduced.

In addition, each of semiconductor device products and mask layers has a greatly different mask layout; therefore, the manufacturing difficulty level of each photomask should be different in reality. However, the photomask manufacturing difficulty level is difficult to make an objective judgment. The DFM in wafer manufacturing can be relatively and remarkably observed as a yield of wafer manufacturing and a process margin. On the other hand, in the photomask manufacturing, in general, objective judgment of manufacturing difficulty level has been difficult because one design is used for manufacturing one mask and thus the yield is difficult to express, use of a second sheet of photomask for defective manufacturing only attains increase of burden on photomask manufacturers, and the cost is not reflected on the unit price of photomasks, and the price of the photomask is, in general, determined by the design node and specifications, and the mask price has not been determined by differences of mask layouts.

Meanwhile, to predict the photomask manufacturing difficulty level, there have been two methods: the MRC (Mask Rule Check (or referred to as DRC (Design Rule Check)) that analyzes the mask layout based on a preconfigured rule and extracts layouts that can pose problems when manufacturing the photomask; and a method to use software for dividing the mask layout by "Shot" that is a unit of lithography of a lithography device for calculating the obtained number of Shots to predict lithography time.

The MRC is used to extract a layout that can pose problems in photomask manufacturing, and issue an alert for prompting a layout correction if possible. However, development of specific means for using the result extracted by the MRC to calculate the load on photomask manufacturing has been a task to be solved. In addition, also in the method using software for calculating the number of Shots from the mask layout and predicting the lithography time, development of means for calculating the load on the whole manufacturing process of the photomasks is a task.

An object of the present invention is to provide a technique for quantitatively expressing the photomask manufacturing difficulty level.

Another object of the present invention is to provide a technique for efficiently manufacturing photomasks.

The above and other objects and novel characteristics of the present invention will be apparent from the description of this specification and the accompanying drawings.

The typical ones of the inventions disclosed in this application will be briefly described as follows.

(1) A method of manufacturing a photomask according to the present invention comprises the steps of:

(a) a photomask ordering party obtaining a photomask manufacturing load index and transferring the photomask manufacturing load index to a photomask manufacturer;

(b) the photomask ordering party ordering photomasks to the photomask manufacturer; and (c) the photomask manufacturer making a plan for manufacturing photomasks based on the photomask manufacturing load index to manufacture the photomasks, and the photomask manufacturing load index is obtained based on a photomask manufacturing difficulty.

(2) The method of manufacturing a photomask according to the present invention further comprises the step of (a1) analyzing a mask layout, and the photomask manufacturing load index includes at least one of a defect guarantee load index and a lithography load index, where the defect guarantee load index is a first function determined based on a number of errors that is an extracted number of patterns to be problematic in the photomask manufacturing extracted in the step (a1) and a priority of patterns that are arranged in the mask layout, and the lithography load index is a second function determined based on: a total number of Shots per a semiconductor chip when taking a unit of lithography of a lithography device as a Shot; and an area of the semiconductor chip.

The effects obtained by typical aspects of the present invention will be briefly described below.

The photomask manufacturing difficulty level can be quantitatively expressed.

Photomasks can be efficiently manufactured.

BRIEF DESCRIPTIONS OF THE DRAWINGS

DESCRIPTIONS OF THE PREFERRED EMBODIMENTS

Figure 1:
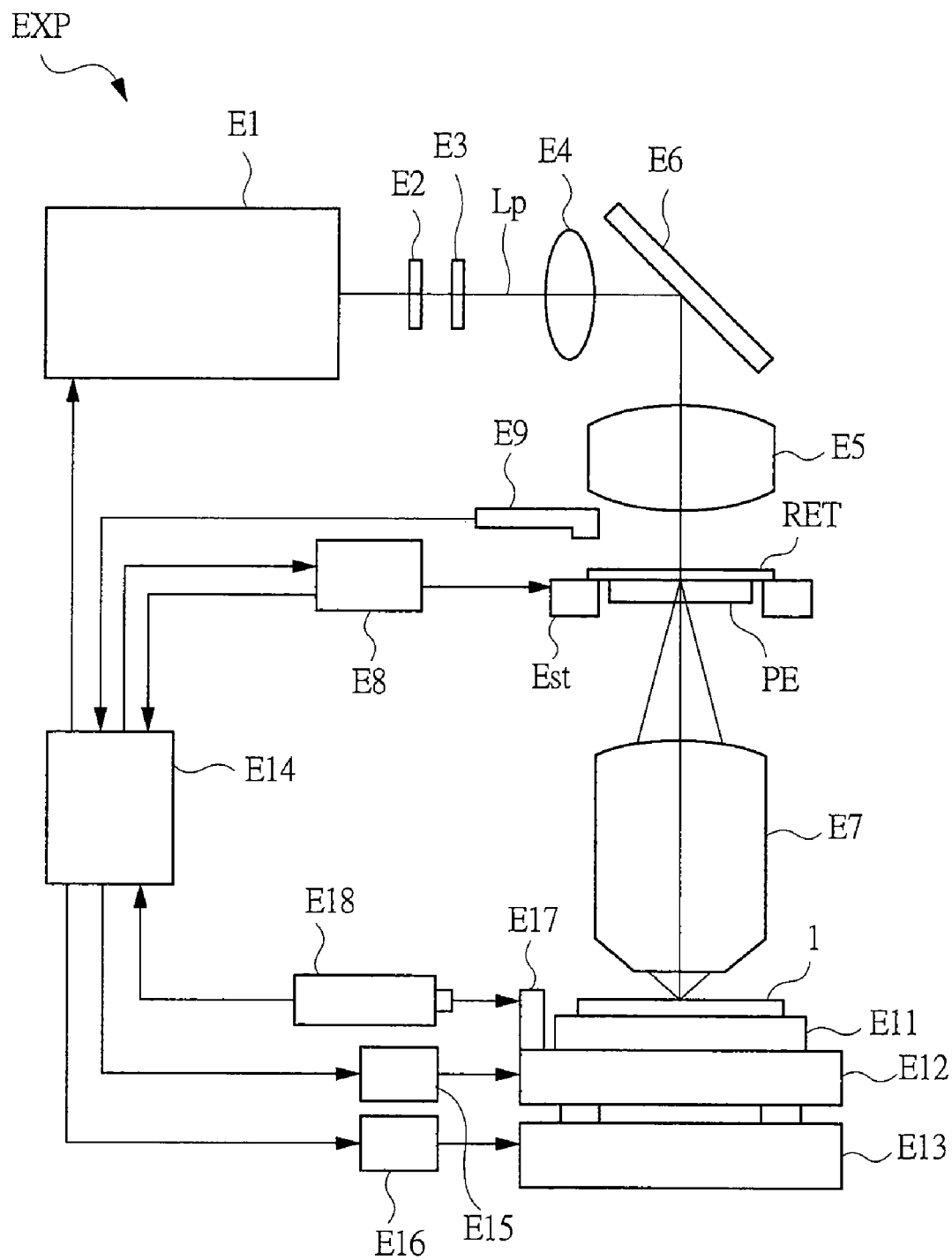
FIG. 1 is a diagram showing an example of a configuration of an exposure device.

Before describing the present invention in the present application in detail, the terms in this application will be defined as follows.

Wafer means a single crystal silicon substrate (in a substantially flat and circular shape in general), an SOI (Silicon On Insulator) substrate, an epitaxial substrate, a sapphire substrate, a glass substrate, other insulating, non-insulating, or semiconductor substrates and a compositive substrate thereof used for manufacturing integrated circuits. In addition, in the present application, a semiconductor integrated circuit device includes not only a device formed on a semiconductor or insulator substrate such as a silicon wafer and a sapphire substrate but also a device built on an insulating substrate such as glass including a TFT (Thin Film Transistor) and an STN (Super-Twisted-Nematic) liquid crystal unless otherwise stated.

A device surface means a main surface of a wafer, on which device patterns corresponding to a plurality of chip areas are formed by photolithography.

A mask is a general term for a substrate on which an original picture of a pattern is drawn, and includes a photomask (reticle) on which a pattern several times as large as the original size is formed. The mask is used for an exposure device using visible light, ultraviolet light, etc. The mask includes an ordinary mask, a phase shift mask, and a resist mask.

The ordinary mask (a metal mask or a chromium mask) means a common mask on which a mask pattern is formed with a light-shielding pattern made from metal and a light transmission pattern on a transparent mask substrate.

Photoresist film, in general, includes an organic solvent, a base resin, and a sensitizer as a main component as well as other main components. The photoresist film means a film in which light for exposure such as ultraviolet rays and electron rays causes a photochemical reaction of the sensitizer, and a product by the photochemical reaction or a reaction by the product working as a catalyst obtained by the photochemical reaction greatly changes the rate of solution from the base resin into a developing solution, and a pattern is formed by exposure and development process performed after the exposure. A photoresist in which the rate of solution from the base resin into the developing solution in an exposure part changes from small to large is called a positive type photoresist, and a photoresist in which the rate of solution of the base resin into the developing solution in the exposure part changes from large to small is called a negative type photoresist. A common photoresist film does not contain an inorganic material as a main component, but as an exception, a photoresist film containing Si is also included in the photoresist film. A difference between the common resist film and a photosensitive SOG (Spin On Glass) is that the photosensitive SOG contains Si—O, Si—N, etc. in the main component and this part is an inorganic material. The main component of the photosensitive SOG is $SiO_2$. The difference between organic and inorganic is determined based on whether $CH_3$ and the like is bonded at the termination part. Generally, the termination with an organic material is more stable and widely used, but either an organic or an inorganic material is possible regardless of the main part of the photosensitive SOG.

Hole pattern means a fine pattern of a contact hole, a via hole (through hole), etc. having a two-dimensional size equal to or smaller than an exposure wavelength on the wafer. In general, the hole pattern has a square shape, a rectangular shape close to that, or an octagonal shape on a mask, but often has a nearly circular shape on a wafer.

Line pattern means a stripe-like pattern for forming wiring etc. on the wafer.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. And, it is needless to say that the wording "comprising A", "including A", "formed of A" etc. about components in embodiments does not exclude other components unless otherwise particularly stated that the components are limited.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

In addition, as materials etc. indicated herein, unless otherwise stated, or unless principally or situationally impossible, specified materials are main materials, and secondary elements, additives, additional elements, etc. are not excluded. For example, a silicon member includes, unless otherwise noted, not only pure silicon but also a binary or ternary alloy (such as SiGe) etc. containing an additional impurity and silicon as main elements.

Also, components having the same function are denoted by the same reference symbols throughout the drawings for describing the embodiments, and the repetitive description thereof is omitted.

Also, in some drawings used in the embodiments, hatching is used even in a plan view so as to make the drawings easy to see.

In the following, embodiments of the present inventions will be described with reference to the drawings.

Embodiment 1

FIG. 1 is a diagram showing an example of the configuration of an exposure device. In FIG. 1, only the parts needed to describe the functions of the exposure device is shown, and the other parts needed for ordinary exposure devices (a scanner and a stepper) are the same in the ordinary range.

An exposure device EXP is a scanning type reduced projection exposure device (scanner) with a reduction ratio of 4:1, for example. An exposing condition of the exposure device EXP is as follows, for example. That is, a KrF excimer laser light with an exposure wavelength of about 248 nm is used for an exposure light Lp, the numerical aperture of an optical lens is NA=0.65, the shape of illumination is circular, and the coherency (σ: sigma) value=0.7. However, the exposure light Lp is not limited to the above-mentioned value, and modifications are possible; for example, the g ray, the i ray, the ArF excimer laser light (wavelength of 193 nm), or the $F_2$ (fluorine) gas laser light (wavelength of 157 nm) can be used.

Light generated from an exposure light source E1 illuminates a mask RET via a fly eye lens E2, an aperture E3, condenser lenses E4 and E5, and a mirror E6. Among other optical conditions, the coherency was adjusted by changing the size of the aperture of the aperture E3. A pellicle PE for preventing defective pattern transfer caused by adhesion of foreign matter is provided on the mask RET. The mask pattern drawn on the mask RET is projected on a wafer (object to be processed) 1 that is a substrate to be processed via a projector lens E7. The mask RET is placed on a stage Est controlled by a mask position control means E8 and a mirror E9, and the center of the mask RET and the optical axis of the projector lens E7 are correctly aligned. The mask RET is placed on the stage Est with a first main surface thereof facing toward the main surface (device surface) of the wafer 1, and a second main surface facing toward the condenser lens E5. Therefore, the exposure light Lp enters from the second main surface side of the mask RET, through the mask RET, to be irradiated on the projector lens E7 from the first main surface side of the mask RET.

The wafer 1 is vacuum contacted on a sample stand E11 with the main surface thereof facing toward the projector lens E7. A photoresist film to be exposed to the exposure light Lp is applied to the main surface of wafer 1. The sample stand E11 is placed on a Z stage E12 that can move in the optical axis direction of the projector lens E7, that is, the direction vertical to the substrate mounting surface of the sample stand E11 (Z direction), and the sample stand E11 on the Z stage E12 is further mounted on an XY stage E13 that can move in directions parallel to the substrate mounting surface of the sample stand E11. The Z stage E12 and the XY stage E13 are driven by respective driving means E15 and E16 based on control instructions from a main control system E14, thereby moving to a desired exposure position. The position of the stages is correctly monitored by a laser measuring machine E18 as a position of a mirror E17 fixed to the Z stage E12. In addition, the surface position of the wafer 1 is measured by a focal position detecting means which an ordinary exposure device has. The surface of the wafer 1 can always be matched with the imaging surface of the projector lens E7 by driving the Z stage E12 according to a result of the measurement.

The mask RET and the wafer 1 are synchronized and driven according to the reduction ratio, and an exposure region scans the mask RET to shrink and transfer the mask pattern on the wafer 1. In this process, the surface position of the wafer 1 is also dynamically driven and controlled with respect to the scan of the wafer 1 by the above-mentioned means. When the circuit pattern of the mask RET is overlapped on the circuit pattern formed on the wafer 1 for exposure, the position of the mark pattern formed on the wafer 1 is detected using an alignment detecting optical system, and the wafer 1 is positioned based on the result of the detection and overlapped to transfer the image. The main control system E14 is electrically connected with network equipment and can perform remote monitoring etc. of the state of the exposure device EXP. While a scanning type reduced projection exposure device (scanner) is used as an exposure device in the description above, an exposure device is not limited thereto, and, for example, a reduced projection exposure device (stepper) that transfers a circuit pattern on the mask onto a desired position on the wafer by repeatedly stepping the wafer with regard to the projected image of the circuit pattern on the mask can be used.

Figure 2:
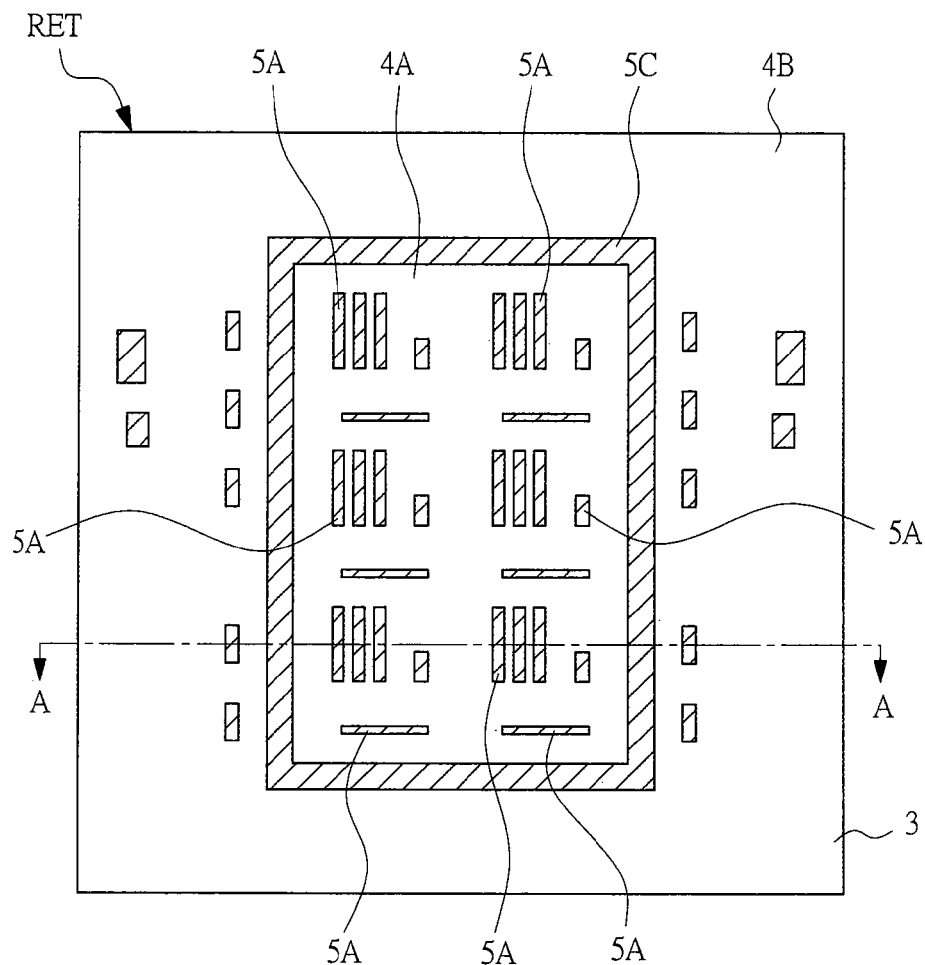
FIG. 2 is a plan view showing an example of a mask.
Figure 3:
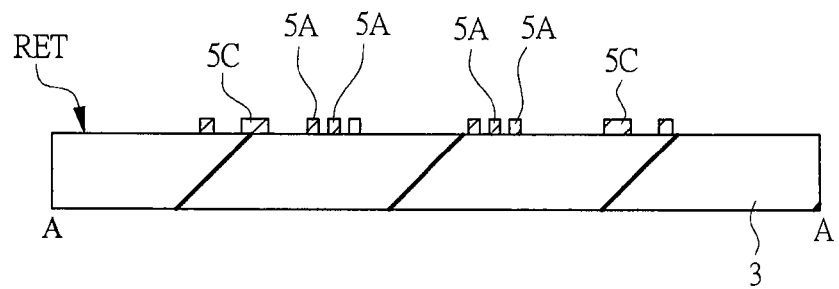
FIG. 3 is a cross-sectional view showing the example of a mask.

FIG. 2 and FIG. 3 show an example of the mask RET. FIG. 3 is a cross-sectional view taken along the line A-A of FIG. 2.

A mask substrate 3 of the mask RET includes a transparent synthetic quartz glass substrate with a thickness of about 6 mm formed in a square planar shape, for example. When the mask RET is used, a positive type photoresist film is used on the wafer.

In the integrated circuit pattern area in the center of the main surface (pattern formation surface) of the mask substrate 3 of the mask RET, a light transmission area 4A in a rectangular planar shape is formed, and a part of the main surface of the mask substrate 3 is exposed. On the light transmission area 4A, a light-shielding pattern 5A formed of metal is located. The light-shielding pattern 5A is transferred as a line pattern (integrated circuit pattern) on the wafer. The light-shielding pattern 5A is formed of Cr (chromium) or Cr deposited with chromic oxide thereon. However, the material of the light-shielding pattern formed of metal is not limited thereto, and various modifications are applicable.

On the main surface of the mask substrate 3, the integrated circuit pattern area is surrounded by a stripe-like light-shielding pattern 5C (metal frame) formed of metal. The material of the light-shielding pattern 5C is the same as that of the light-shielding pattern 5A. Also, a light-shielding film is removed from the most part of the surrounding area of the mask RET to form a light transmission area 4B.

Figure 4:
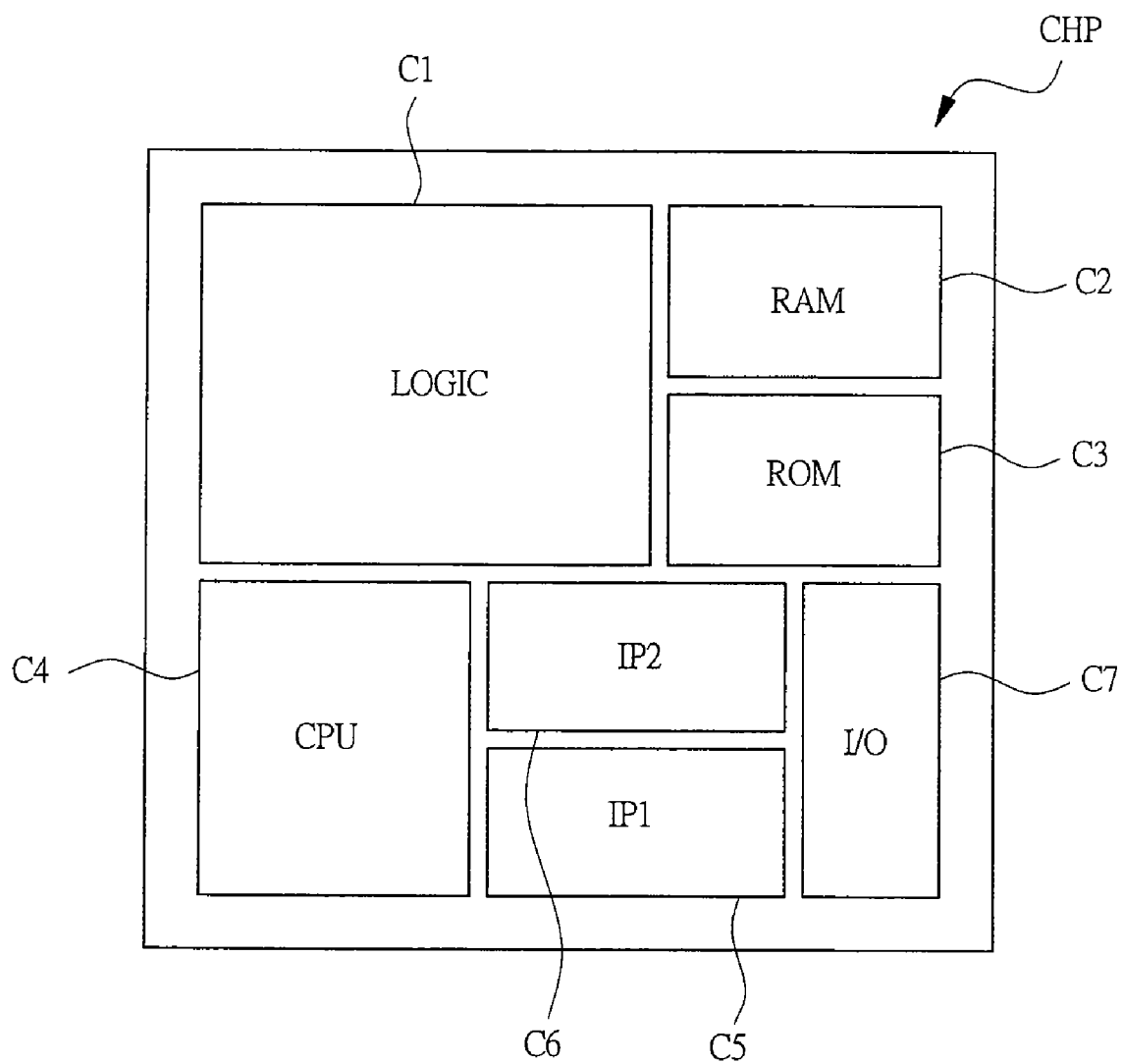
FIG. 4 is a diagram showing a circuit block of an SoC.

Meanwhile, when a semiconductor chip (hereinafter, simply referred to as chip) CHP formed to the wafer (refer to FIG. 4) is an SoC product in which a plurality of circuit blocks, such as: a logic circuit C1; a RAM (Random Access Memory) circuit C2; a ROM (Read Only Memory) circuit C3; and a CPU (Central Processing Unit) circuit C4; an IP (Intellectual Property) circuits C5 and C6; and an input/output circuit C7 are formed on one chip, each circuit block has a different circuit (wiring) design rule. For example, the wiring that forms the logic circuit C1 is formed with the smallest feature size, and is arranged with the most complicated circuit pattern or with the highest wiring density; on the other hand, the input/output circuit C7 has a processing dimension of the wiring not as small as that of the logic circuit C1, a wiring pattern not as complicated as that of the logic circuit C1, and a wiring density not as high as that of the logic circuit C1. The processing dimension of the wiring, the complexity of the wiring pattern, and the wiring density, etc. of the RAM circuit C2 is almost between those of the logic circuit C1 and the input/output circuit C7.

Figure 5:
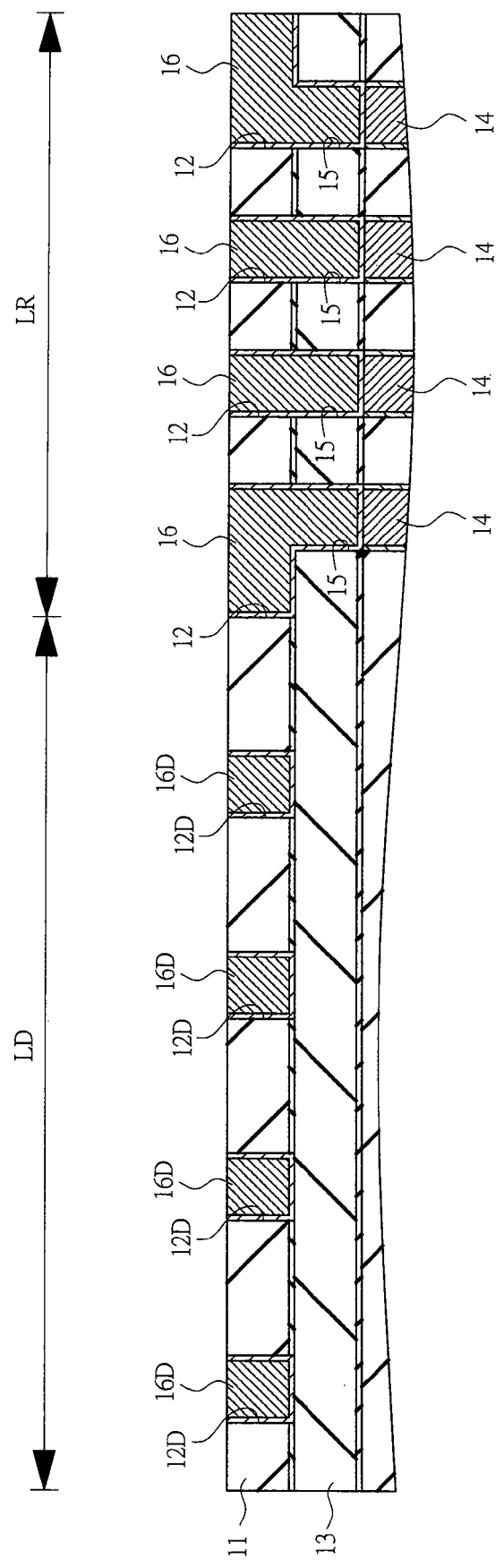
FIG. 5 is a cross sectional view of a main part showing a buried wiring formed of a copper film or a copper alloy film buried in a wiring trench formed in an interlayer insulation film.

Furthermore, the feature size of the wiring, complexity of the circuit pattern, and the wiring density, etc. are different for each wiring layer even in the same circuit block. In addition, as shown in FIG. 5, even in the same wiring layer, for example, when a buried wiring 16 is formed by burying a copper film or a copper alloy film containing copper as a main component in a wiring trench 12 (hereinafter, the wiring trench 12 includes a connection hole 15 that is formed in an interlayer insulation film 13 located in the lower layer under the wiring trench 12, and that reaches a wiring 14 in the lower layer) formed in an interlayer insulation film 11 on the semiconductor substrate (wafer (not shown)), the area LR in which the buried wiring 16 is formed and the area LD in which the buried wiring 16 is not formed have different wiring densities. To form the buried wiring 16, for example, a copper film or a copper alloy film is deposited on the interlayer insulation film 11 including the inside of the wiring trench 12 to bury the wiring trench 12 with the copper film or the copper alloy film and then the excessive part of copper film or the copper alloy film on the interlayer insulation film 11 is removed by polishing with the CMP (Chemical Mechanical Polishing) method. However, polishing on the same wiring layer with the CMP method when the areas LR and LD have different wiring densities may disadvantageously cause the polishing to be progressed locally, what is called dishing and erosion, so that the buried wiring 16 is shrunk or a step on the same wiring layer is generated. For this reason, there is a method for making the wiring densities of the area LR and area LD closer by forming a wiring trench 12D and a dummy wiring 16D in the area LD where the buried wiring 16 is not formed in the same process as the one for forming the wiring trench 12 and the buried wiring 16. The dummy wiring 16D is not connected with the wiring 14 in the lower layer, and does not function as a circuit. The buried wiring 16 and the dummy wiring 16D mentioned above have different feature sizes, complexities of wiring patterns, etc.

The mask manufacturing difficulty level (photomask manufacturing difficulty level) literally means a difficulty for manufacturing the mask RET that satisfies the quality (feature size accuracy of the wiring, pattern position accuracy, defect quality, etc.) required by a mask ordering party (mask user), and expresses an amount of labor (load) required for manufacturing, shipping, and delivering the mask RET. Manufacturing of a mask RET is, different from manufacturing of the wafer, a multiproduct production in small quantities, in which only several masks are manufactured with respect to one design. Therefore, the "yield (the number of passed lots (chips) to the number of fed lots (chips))" used in wafer manufacturing cannot express the mask manufacturing difficulty level for a mask layout.

The main factors for determining the mask manufacturing difficulty level include: (i) elements regarding layout of patterns such as the complexity of the pattern (light-shielding pattern 5A), dimensions, and the number of figures on the mask RET; (ii) elements regarding selection of materials and manufacturing process of the mask RET; (iii) elements regarding the quality specification values required for mask RET influencing pass and fail of the mask RET relating to the process capability for manufacturing the mask RET; and (iv) elements regarding the period (delivery date) left before the delivery due date (deadline) specified when ordering the mask RET. Therefore, to lower the mask manufacturing difficulty level (it means that to ease manufacturing, and to lower the manufacturing cost in the present embodiment), the following efforts are important: (a) to change the pattern (light-shielding pattern 5A) on the mask RET from a layout difficult (load is high) to manufacture the mask RET to a layout easy (load upon manufacturing is low) to manufacture the mask RET; (b) to select the material and the manufacturing process of the mask RET from general-purpose low cost materials, not from special high-cost materials; (c) to set the specifications (CD (Critical Dimension) specifications (MTT, range, etc.), defect specifications, etc.) required for the mask RET to minimum, or to use the mask RET by adjusting the wafer process so as to compensate a finished dimension, shape, etc. of the mask RET; (d) to set sufficiently long delivery date for manufacturing the mask RET. Note that, the condition (b) means that even a mask RET using a material having a low quality control level can be satisfactorily used for wafer manufacturing, and is premised on that a mask pattern (layout) with a large margin in the wafer process or a wafer process with a large tolerance of a mask error is built.

As to the selection of the materials and manufacturing processes in the above-mentioned factor (ii), the quality of the mask RET (for example, CD accuracy, flatness accuracy, transmittance, control of a phase angle, variation in a surface, etc.) is often fixed for each design node to which the semiconductor device product belongs due to the tolerance of wafer manufacturing. As to the delivery date setting of the above-mentioned factor (iv), a standard delivery date is often fixed depending on the type (binary, Att-PSM, Levenson) and the design node of the mask RET. The specification setting of the above-mentioned factor (iii) is commonly fixed depending on the type and the design node of the mask RET.

In the mean time, as an effort to lower the mask manufacturing difficulty level, there is a technique to use a specification with higher flexibility with characteristics (process window) of the wafer manufacturing process taken into consideration. With respect to this, in the manufacturing situation of each mask RET, it is known from experience that the process capability of the mask RET manufacturing against the specification setting in the above-mentioned effort (c) and the manufacturing period actually needed against the delivery date setting in the above-mentioned effort (d) are both influenced by the complexity of the layout on the mask RET in the above-mentioned factor (i). Even when a design rule is set for each design node and the completed layout is within the range of the rule, the number of layout parts to which the minimum size is adopted and the arrangement within the layout are clearly different for each semiconductor device product. The differences of the layouts by product cause differences in manufacturing difficulty levels per respective masks RET, thereby resulting in difference in costs and periods (work period) needed for manufacturing the mask RET. Therefore, an indicator for measuring the manufacturing difficulty level of the mask RET preferably excludes elements influenced by other factors and subordinate elements thereof and uses information of mask design (layout) as elements for judgment.

As mentioned above, manufacture of the mask RET is a custom-ordered production with each product having a custom design therefor, and the actual condition of mask manufacturing is difficult to be reflected compared to the yield calculation of the semiconductor device products mass-produced with same products. Furthermore, the manufacturing difficulty level for each mask RET is difficult to know only from specified specification values and design node, and difficulty is revealed abruptly in some cases after manufacturing has actually begun. Especially, when such a situation arises with an SoC product for which a sample product must be quickly delivered to a customer, not only the cost of the mask RET increases, but also the manufacturing and sales plans of the wafer are influenced due to the delayed delivery of the mask RET, possibly causing a serious problem. To prevent the undesirable situation as mentioned above, it is important for both the mask ordering party and the mask manufacturer to know the mask manufacturing difficulty level of each mask RET based on the layout information of the mask RET in an early stage.

Therefore, the inventors of the present invention have developed a technique for quantifying the manufacturing difficulty level (load given to mask manufacturing) of each mask RET by the difference of a layout, and a system for realizing the technique (hereinafter, referred to as a mask manufacturing load prediction system). In this technique, the mask ordering party analyzes a mask layout in advance (before outputting mask layout data to the mask manufacturer for order) to predict the mask manufacturing difficulty level. The mask manufacturing load prediction system according to the present embodiment will be described in detail hereinafter.

Figure 6:
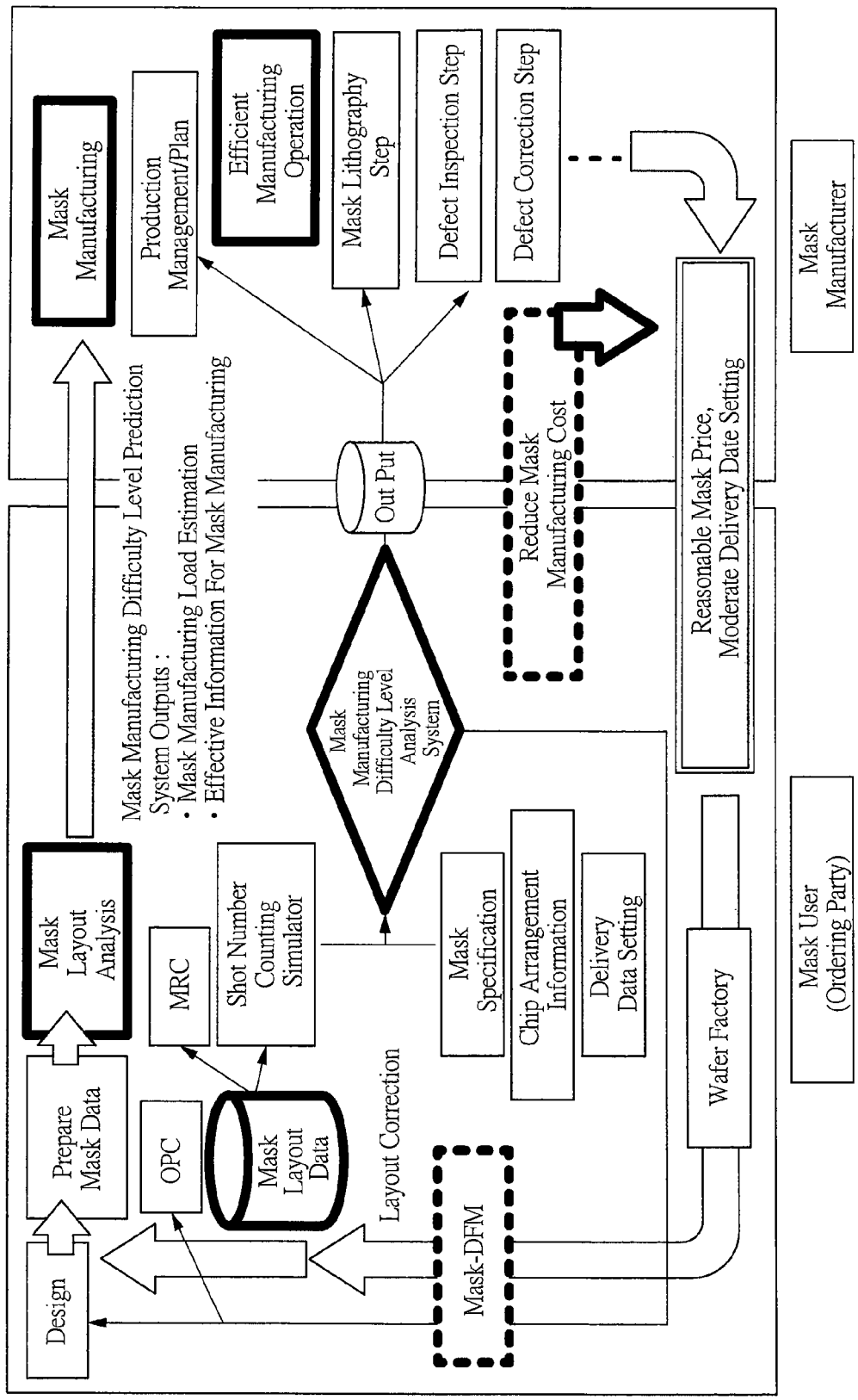
FIG. 6 is a workflow diagram of a mask manufacturing load prediction system used in a method for manufacturing a photomask according to an embodiment of the present invention.

FIG. 6 is a workflow diagram of the mask manufacturing load prediction system according to the present embodiment. Input information used as a base of the mask manufacturing load prediction system in according to the present embodiment shown in FIG. 6 includes a result of the design rule checking (DRC) of the layout of each chip, output information from a simulator that calculates the number of Shots that are the smallest unit of mask lithography with an electron beam, and mask order specification information such as the number of chip arrangement and specification settings. Patterns that could give load on mask manufacturing are detected from a chip layout using the MRC tool, and information on the number and positions of the extracted layout parts for each rule is generated. Division into the Shot that is the minimum lithography unit of photolithography performed on the whole chip layout surface with a mask electron beam lithography device is simulated with a Shot number calculation simulator to predict the total number of Shots. Shrinkage of the design dimension of the light-shielding pattern 5A, improvement in the degree of integration of the layout, and OPC processing have great influences to increase the complexity of the layout of the light-shielding pattern 5A so that the number of Shots in the mask electron beam lithography increases, and it results in longer lithography time with the mask electron beam. Therefore, as input information for estimating the load given to the mask lithography step, a predicted value of the number of Shots is used. In addition to this, the area of the chip layout and design intent information that distinguishes a specific layout capability/function are also used as input information. Both of the information can be obtained before ordering a mask by using layout data on which the party who requests (orders) mask creation has performed the OPC processing. And, the information can be also created at the layout verification in the developmental stage. Next, a relation between a result of an investigation of an actual mask manufacturing process load condition and input information from a layout analysis (MRC and a Shot number counting) is examined to set a coefficient for calculating an index expressing an overall mask manufacturing difficulty level and a mask manufacturing load index. Although the formula of the mask manufacturing load index will be described later, the mask manufacturing load index is an overall index using layout analysis input information and the mask order specification information per the chip unit. Based on the mask manufacturing load index, the mask manufacturer schedules production of the mask, and sets a price of the mask.

With the mask manufacturing load prediction system according to the present embodiment to perform the workflow shown in FIG. 6, different mask manufacturing difficulty levels for each mask layout, product, and mask layer can be relatively known with the mask manufacturing load index obtained by the formula described later, and at a stage where layout correction is possible, the final layout can be corrected to a layout with low difficulty to reduce the mask manufacturing cost. In addition, with the mask manufacturing load prediction system according to the present embodiment, with a mask for manufacturing a semiconductor device at the mass production stage after the developmental stage is finished, not only calculation for estimating the mask manufacturing difficulty level is performed, but also information regarding the layout that can increase the efficiency of mask manufacturing and can reduce the manufacturing cost is extracted so that a mechanism enabling the mask ordering party to provide the mask manufacturer with information regarding the mask manufacturing difficulty level at an early stage.

The mask manufacturing difficulty level is reflected on the mask manufacturing cost as a result, therefore, the breakdown of the manufacturing cost is used as base information for the calculation to predict the difficulty level. The manufacturing cost is, in general, divided into three categories including: (i) cost required for mask inspection and defect correction, (ii) cost required for mask electron beam lithography, and (iii) cost required for other materials and manufacturing processes. Among these costs, the cost for (i) and (ii) respectively accounts for about ¼ to ⅓ of the whole cost. In addition, the proportion of the load of (i) and (ii) is predicted to increase as the design node of the mask RET progresses. Therefore, in the present embodiment, with a focus on a defect guarantee step load (including the inspection load) to determine (i), and a mask lithography step load to determine (ii), a formula for estimating the layout-caused mask manufacturing load that is mainly concerned with the average period of time required for each step from the analysis information (the number of extracted MRC errors, and the number of Shots) of the layout is set as follows. That is, MMI=a1×DAT+a2×EBI, where DAT=f(x) and EBI=f(y) Here, MMI is the mask manufacturing load index; DAT is a defect guarantee load index; EBI is a lithography load index; a1 and a2 are coefficients for adjusting the difference in weighting in the mask defect assurance step and the mask lithography step in a manufacturing environment; f(x) is a function (first function) of the variable x determined by the number of MRC errors, design indent information and the chip area; and f(y) is a function (second function) of the variable y determined by the number of Shots and the chip area.

The layout-related mask manufacturing difficulty level different for each mask RET can be expressed as the mask manufacturing load index MMI as mentioned above. The mask manufacturing load index MMI can be expressed with a linear combination of a defect guarantee load index DAT expressing the load of a defect guarantee step (defect inspection (first load) and defect correction (second load)) and a lithography load index EBI expressing the load of the lithography step. Moreover, a1 and a2 are related with at least one of, for example, a mask ordering party, a mask manufacturer, the number of respective application devices of inspection and lithography owned, the price of the devices, running cost, arrangement layout of the chips within the wafer surface, the number of the chips in the wafer, a product classification of the chips, specifications of the mask, a material used for manufacturing the mask, the manufacturing step of the mask, the delivery date of the mask, etc.

The defect guarantee load index DAT includes, as coefficients of a function, the number of the errors detected by the MRC, distinction of the layout by the priority (design intent) indicated in the layout, the relative ratio of the mask manufacturing load for each layout distinguished by adopting operation in various mask manufacturing that distribute the mask manufacturing load based on the layout distinction, and the chip area and the pattern area. The lithography load index EBI is a function combining the total number of Shots per chip and the area (chip area) of the mask electron beam lithography area.

Figure 7:
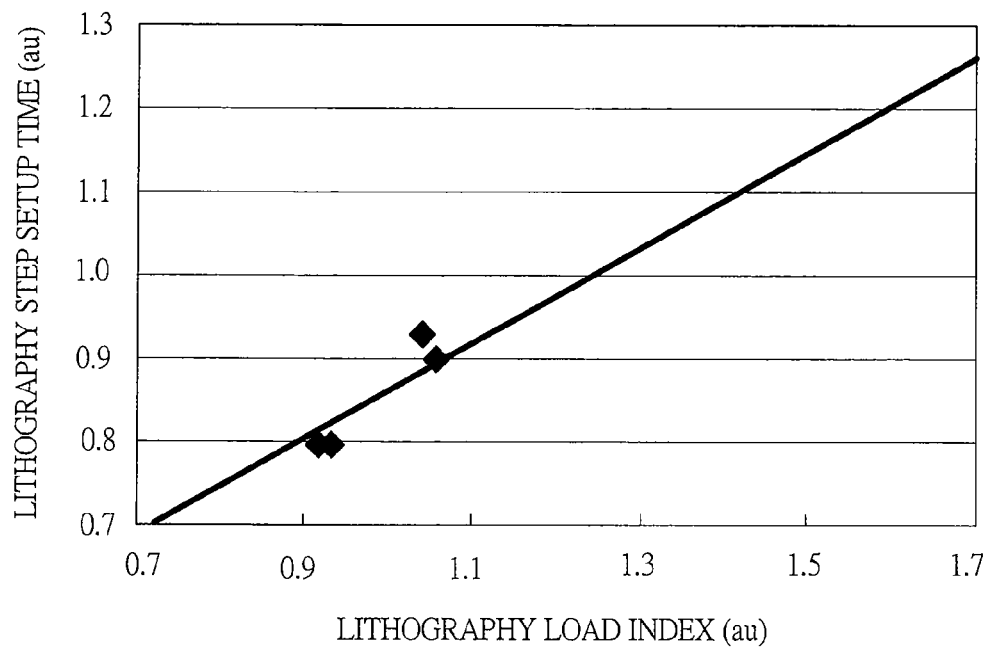
FIG. 7 is an explanatory diagram showing a relationship between a lithography load index and a set-up time of lithography step.

The mask electron beam lithography is performed by irradiating the surface of the resist applied to a surface of the mask substrate 3 (refer to FIGS. 2 and 3) with a convergent electron beam formed in a rectangular shape by a diaphragm according to the mask layout so that a pattern is formed on the mask. The rectangular shaped figure is the above-mentioned Shot, and an electron beam is scanned with the Shot as the minimum unit. Therefore, increase of the number of Shots increases the number of times to move the electron beam, resulting in longer lithography time. In addition, on the mask substrate 3, for the area located outside the range in which the electron beam can be moved by polarization, the beam is moved continuously or in the step-and-repeat system in turn so that the electron beam is scanned on the whole surface of the mask to draw a pattern. Therefore, the area of the target area to be drawn is influenced by the period of time to move the stage. To improve the quality of the lithography pattern, there is a method to perform the lithography several times with a less quantity of electricity per electron beam irradiation. In calculation of the lithography load index EBI according to the present embodiment, information on the number of Shots predicted in the simulation using the layout data after OPC is used. The total number of Shots to be generated with an actual lithography device can be predicted with the number of Shots predicted in this simulation. FIG. 7 shows a relation between the lithography load index EBI and the lithography step set up time for the mask RET, where the lithography load index EBI is calculated using the chip area (calculated with the designed size of the chip) known in advance and the number of Shots predicted in the simulation, for products with a minimum feature size of the chip of about 67 nm. Both the lithography load index EBI and the lithography step set up time are shown with the relative values (the unit therein is au (arbitrary unit)) based on an arbitrary reference value. As shown in FIG. 7, sufficient correlation is observed between the lithography load index EBI obtained by calculation and the lithography step set up time, and the lithography load can be predicted with the information on the number of Shots predicted by the simulation with the mask layout, and the lithography load index EBI based on the area information of the layout. That is, the mask manufacturing load index MMI that indicates the mask manufacturing load can be predicted with the lithography load index EBI.

According to the above-mentioned present embodiment, the mask manufacturing load index MMI can be calculated by mask layout with the mask manufacturing load prediction system before transmission of mask ordering data, and mask manufacturing can be performed easily by checking the mask manufacturing load index MMI in advance at the developmental stage etc. Thereby, the efficiency of mask manufacturing can be improved. In addition, the improved efficiency of mask manufacturing reduces the manufacturing cost of the mask, resulting in the reduced cost of the mask.

Embodiment 2

Design intent in the present embodiment means a priority classification of layout according to a designer's intention, and this information can be incorporated in mask layout data to be used for mask manufacturing. For example, the information is used for operation of the mask defect standard set depending on the priority of patterns, including: (a) different inspection sensitivity according to the priority; (b) differentiation of the determination of a defect after detection; and (c) differentiation of correction of a detected defect and an inspecting method and standard after correction. The design intent can be used to ease the defect standard of a portion with a relatively low priority of a pattern, and relatively reduce the load of the defect inspection and the defect correction. In addition, since the load on mask manufacturing differs according to the priority of a pattern, the load of the actual defect guarantee step of the whole chip (or mask) can be predicted by calculating the area of a pattern and an area assigned to each priority, and by expressing an effect of adjusting the mask defect standard etc. by priority with relative weighting. An effective inspection area is calculated with the following formula based on this idea. That is, the effective inspection area EIA can be calculated with a formula expressed by EIA=b1×S1+b2×S2+..., where S1, S2, ... are sums of the areas of patterns or areas having the priorities 1, 2, ... given by the design intent, and b1, b2, ... are coefficients to expresses the respective weightings. The effective inspection area EIA influences the defect correction step in the defect guarantee, and the defect guarantee load index DAT that determines the mask manufacturing load index MMI described in Embodiment 1. That is, the mask manufacturing load index MMI indicating the mask manufacturing load can be predicted from the effective inspection area EIA.

According to the above-described present embodiment, in the same manner as Embodiment 1, the mask manufacturing load index MMI can be calculated by mask layout with the mask manufacturing load prediction system before transmission of mask ordering data, and mask manufacturing can be performed easily by checking the mask manufacturing load index MMI in advance at the developmental stage etc. Therefore, the efficiency of mask manufacturing can be improved. In addition, the improved efficiency of mask manufacturing reduces the manufacturing cost of the mask, resulting in the reduced cost of the mask itself.

Embodiment 3

Figure 8:
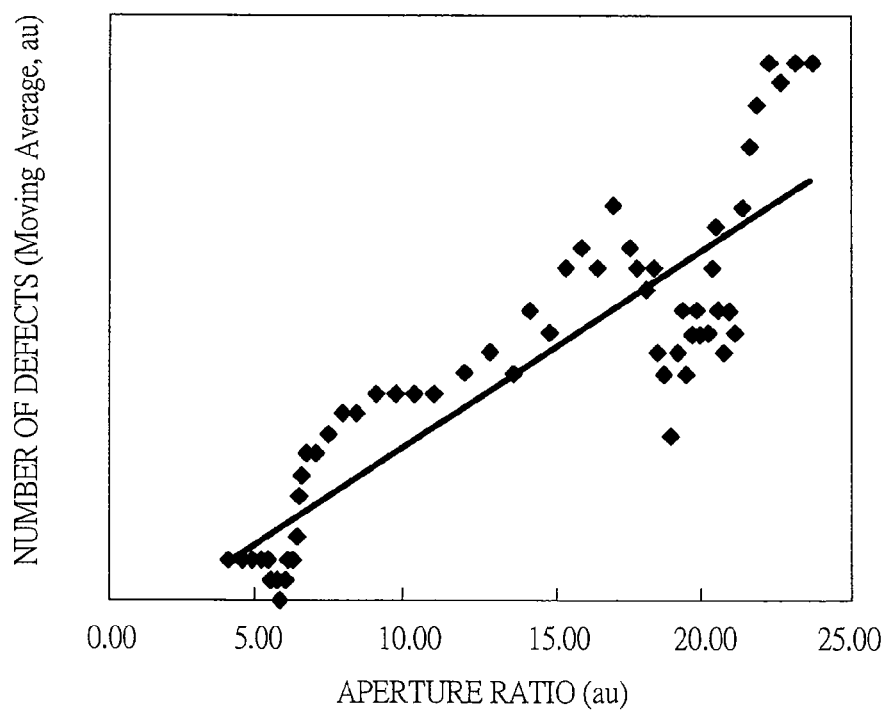
FIG. 8 is an explanatory diagram showing a relationship between a number of defects and an aperture ratio for each mask.

Among the defect guarantee load index DAT described in Embodiment 1, a defect correction step set up time is related to a defect correction load, and the defect correction step set up time is related to the number of the defects to be corrected. The number of defects is related to the aperture area (area of a mask pattern drawing part). FIG. 8 shows the relation of the number of defects and the aperture ratio for each mask of the masks for products with a minimum feature size of about 90 nm on a chip. The number of defects is influenced by the quality of a material used for mask manufacturing, a situation of the manufacturing step, a condition of the manufacturing step, etc. and, as shown in FIG. 8, the number of generated defects increases with the increase of the aperture ratio. That is, the probability of defects being generated is larger when the area of the pattern to be guaranteed is larger, resulting in heavier load of defect correction. Especially, in the defect guarantee of the masks for high-technology semiconductor devices, application of a highly precise defect correction technology and application of a verification method for a defect correction part are essential, increasing the defect correction load. As described above, the defect correction load can be predicted from a mask layout including a design intent by connecting the effective inspection area EIA described in Embodiment 2 with the defect correction load. That is, the mask manufacturing load index MMI indicating the mask manufacturing load can be predicted from the defect correction load.

According to the embodiment as described above, the same effects as those of Embodiments 1 and 2 can be obtained. In addition, the effect of the effort (mask DFM) for making manufacturing of a mask for a high-technology semiconductor device easier can be quantitatively verified, and any workflow using the DFM method to be performed thereafter can be effectively accelerated.

Embodiment 4

Figure 9:
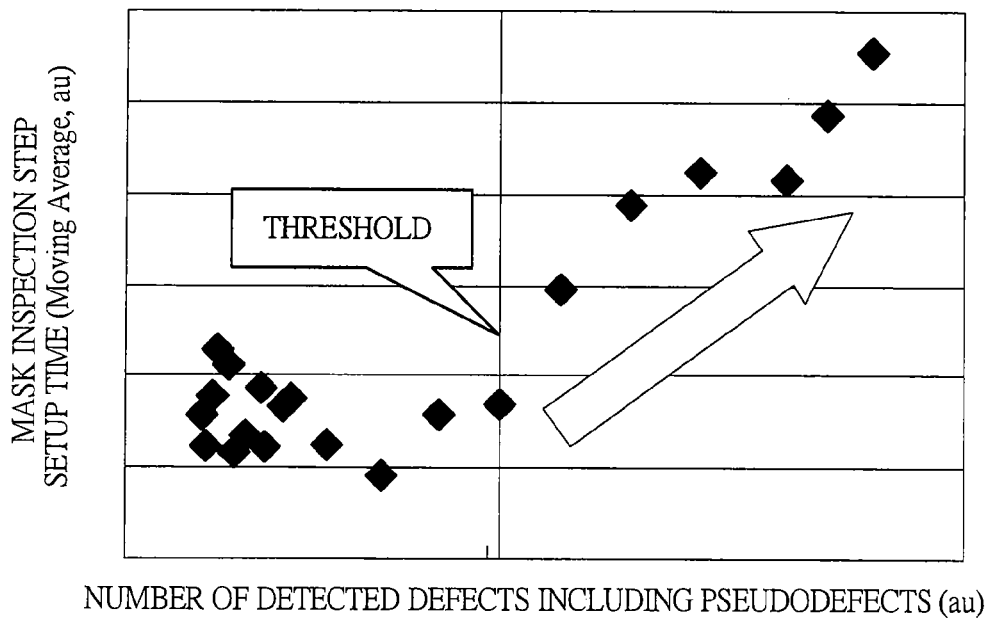
FIG. 9 is an explanatory diagram showing a relationship between a number of detected defects per mask (including pseudodefects) and a set-up time of mask inspection step.

Mask inspection is one of the steps that need the longest period of time in the manufacturing process of a mask. The mask inspection step can be performed in general within a fixed period of time, but since layouts are different for each mask, pseudodefects are occasionally and unexpectedly generated to add additional work including more review operations, reexamination of an inspection sensitivity setting, and consultation with a mask ordering party, etc. In these cases, the load of the mask inspection step increases. FIG. 9 shows a relationship between the number of detected defects per mask (including pseudodefects) and the mask inspection step set up time, and indicates that when the number of detected defects per mask increases and exceed a threshold, the mask inspection step set up time tends to increase. The actual number of defects is controlled to be small in number by process control, and most of the detected defects of FIG. 9 are judged to be pseudodefects; therefore, a mask layout with a possibility to have a plurality of pseudodefects increases the load of the mask inspection step.

Therefore, in the present embodiment, a rule assuming a shape and a size (dimension) of a layout that may have a pseudodefect is set; the MRC with the rule incorporated is implemented to the layout information; and the load of the inspection step is predicted based on the number of errors extracted by each rule. As described above, the load of the defect guarantee step including the load of the defect correction step and the load of the inspection step is a combination of the information of the number of errors extracted by the MRC and an effective inspection region, and the defect guarantee load index DAT described in Embodiment 1 can be determined from these information.

According to the embodiment as described above, the same effects as those of Embodiment 1 can be obtained.

Embodiment 5

In Embodiment 5, calculation of a mask manufacturing load index MMI that is set as described in Embodiments 1 to 4 is implemented to a mask layout in a critical step of a semiconductor device (chip) with a minimum feature size of 90 nm to compare the outputted mask manufacturing load index MMI by product and by mask layer. The critical step herein means a step that needs especially detailed processing and that requires not only the accuracy of size of a pattern, but also an especially fine alignment margin of the pattern.

Figure 10:
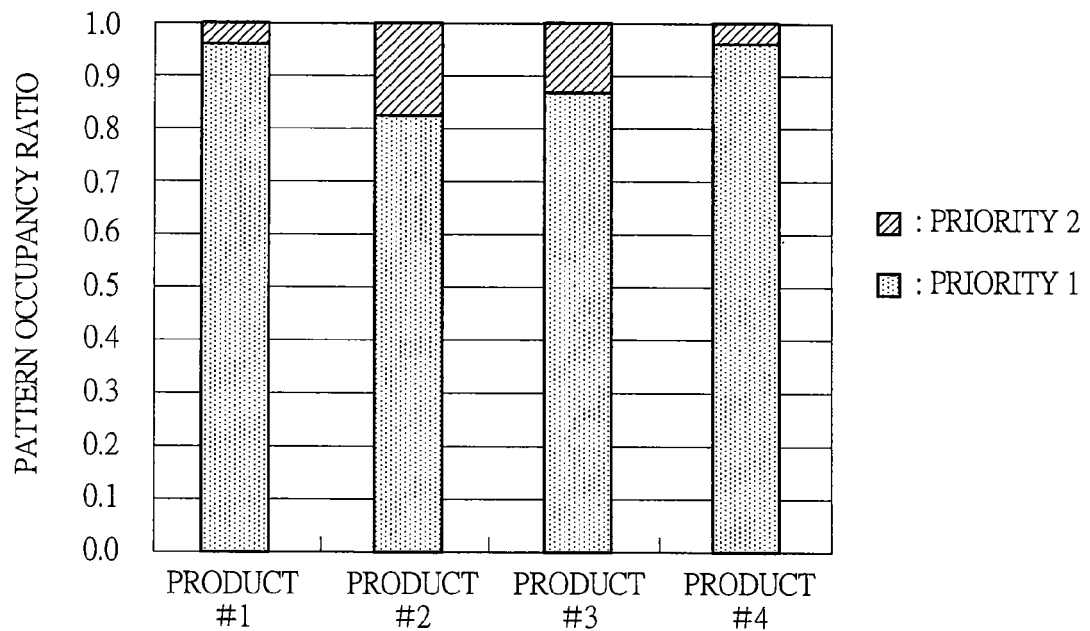
FIG. 10 is an explanatory diagram showing a proportion of a pattern occupancy area differentiated by priority based on a design intent.
Figure 11:
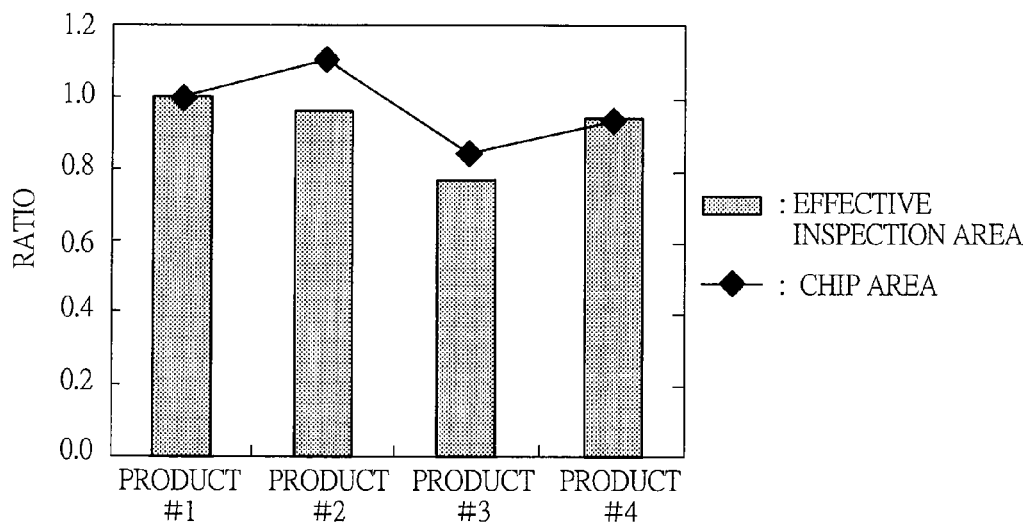
FIG. 11 is an explanatory diagram showing an effective inspection area and a chip area for each product by a ratio thereof.
Figure 12:
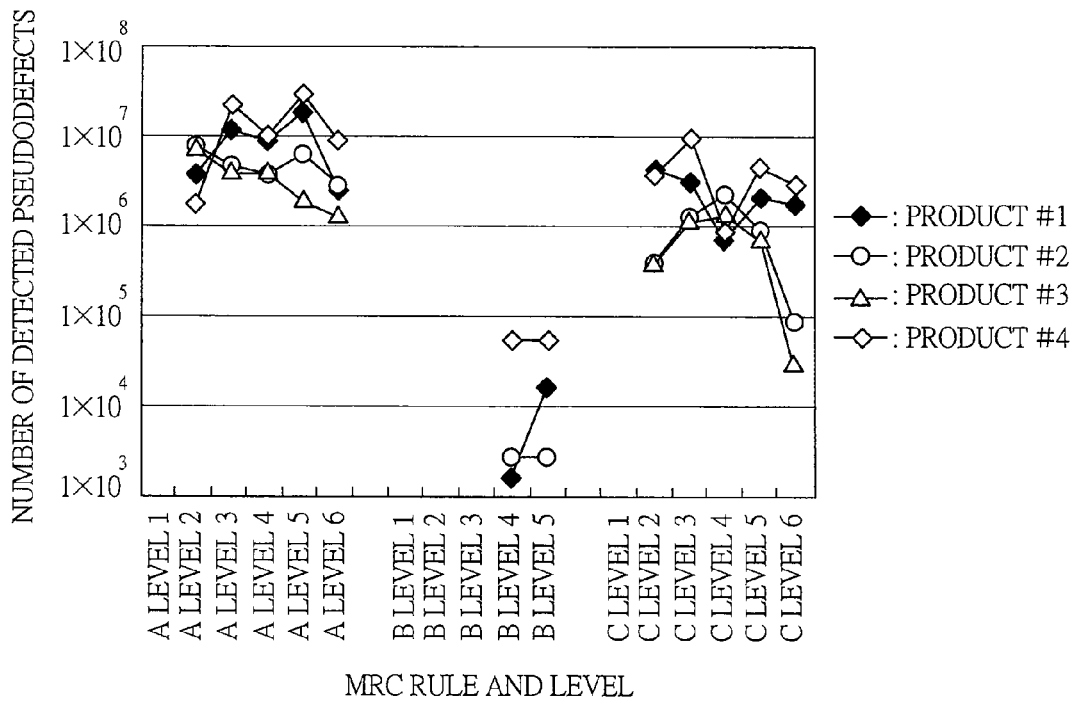
FIG. 12 is an explanatory diagram showing a number of layout parts that may have pseudodefects by MRC rules and levels.
Figure 13:
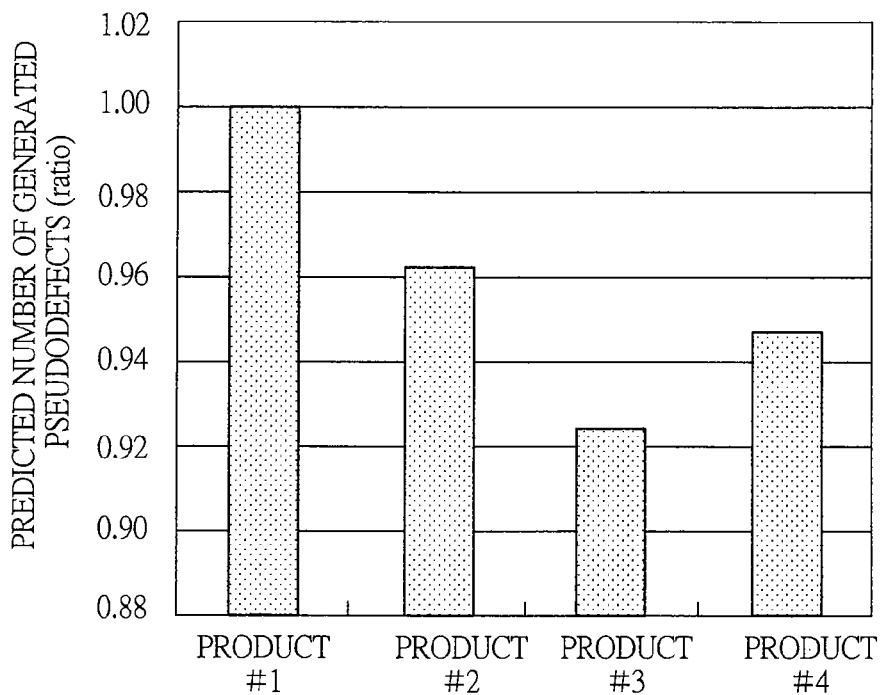
FIG. 13 is an explanatory diagram showing a predicted number of generated pseudodefects for each product standardized by product #1.
Figure 14:
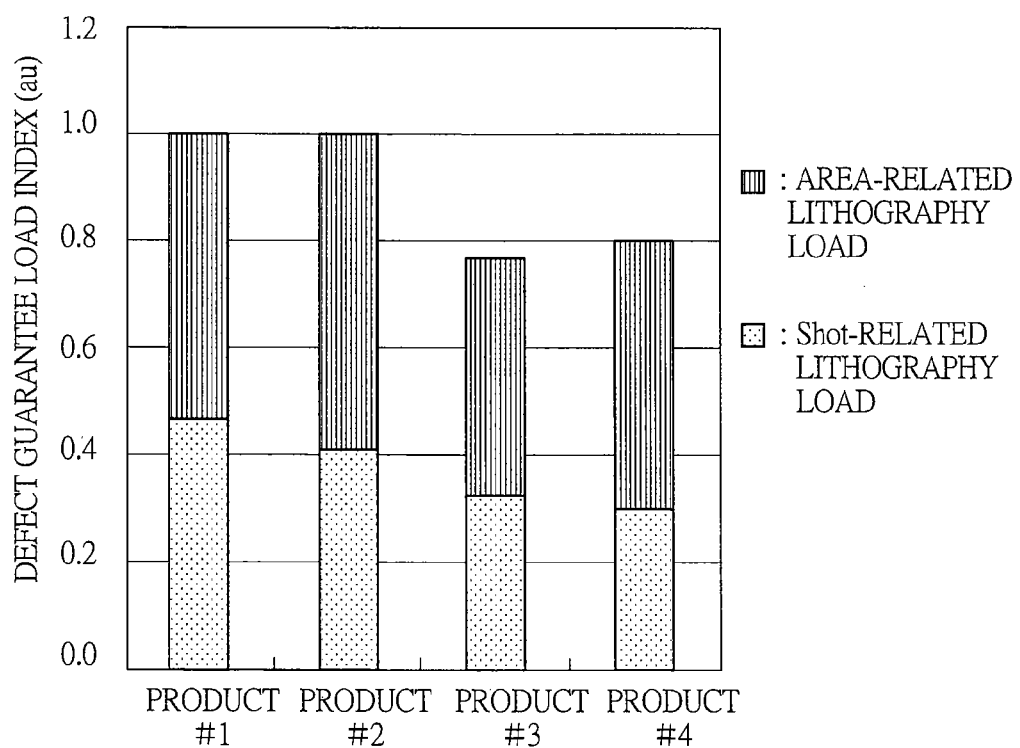
FIG. 14 is an explanatory diagram showing a defect guarantee load index obtained by using the effective inspection area and the predicted number of pseudodefects for each product.
Figure 15:
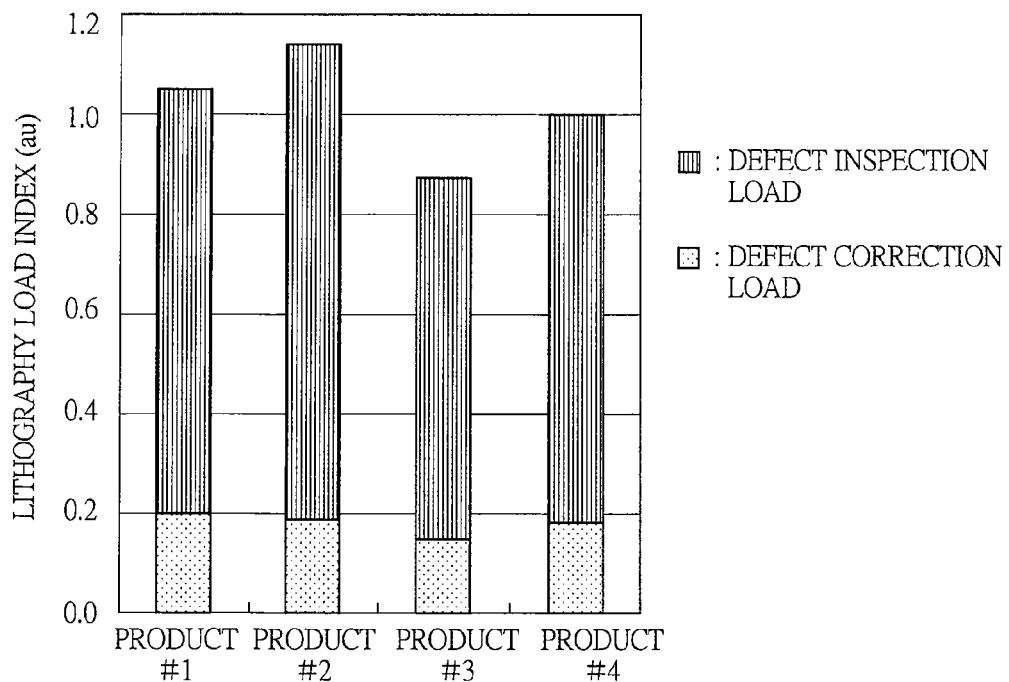
FIG. 15 is an explanatory diagram showing a lithography load index calculated from an output of a Shot number counting simulation and the chip area.
Figure 16:
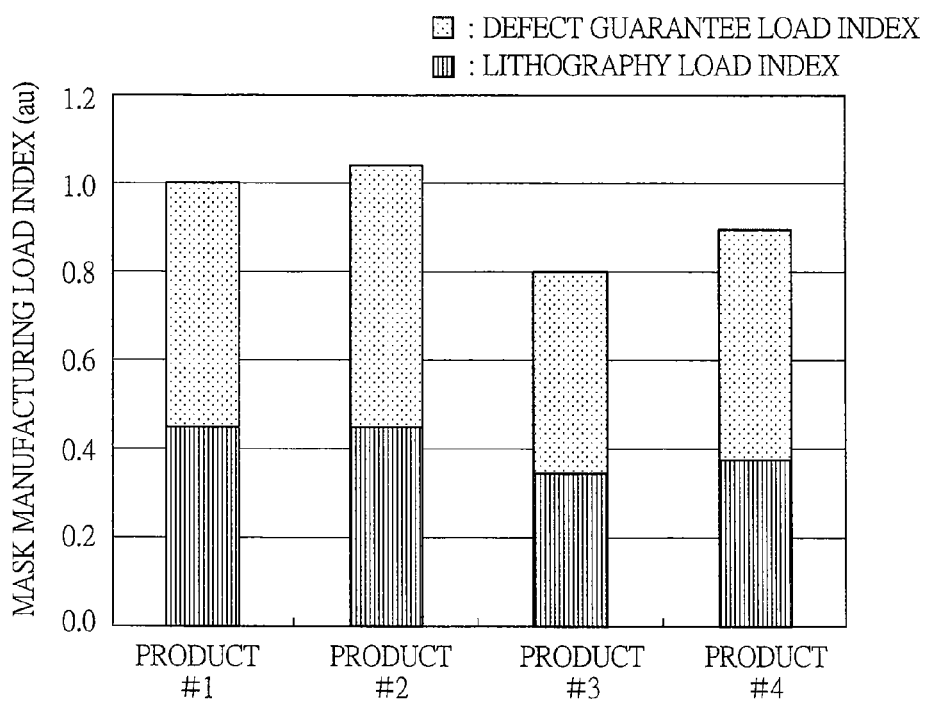
FIG. 16 is an explanatory diagram showing an overall mask manufacturing load index adding the defect guarantee load index and the lithography load index.

FIG. 10 shows the pattern occupancy area in a metal (wiring) layer of a product (chip) with a minimum feature size of about 90 nm on a chip, indicating the proportion of the area by priority based on the design indent. In FIG. 10, priority 1 needs higher assurance accuracy than priority 2. An effective inspection area EIA (refer to Embodiment 2) is calculated by combining the ratio shown in FIG. 10 and the chip area (lithography pattern occupancy area) for each product (refer to the bar graph of FIG. 11). The effective inspection area of FIG. 11 is standardized by product #1. The effective inspection area (area that is actually necessary to be provided with defect quality assurance) is determined by the layout for each product and the definition method of the design intent. FIG. 12 summarizes the number of the layout parts that may have a pseudodefect extracted by the MRC, and the layout that may have the pseudodefect is extracted with each MRC rule (categories (for analysis) A, B, and C, and levels 1 to 6 for each category (analysis standard that is set up in advance (category B has 1 to 5 levels))), and the relative weighting is set for the possibility of the pseudodefect to be generated in each MRC rule to calculate the predicted number of generated pseudodefects for each mask with the total of the number of MRC extraction multiplied by the weighting. FIG. 13 shows the predicted number of generated pseudodefects for each product standardized by product #1. FIG. 14 is a defect guarantee load index DAT calculated using the above-mentioned effective inspection area and the predicted number of pseudodefects (refer also to Embodiment 1). The lithography load index is calculated from the output of a Shot number counting simulation and a chip area as shown in FIG. 15, and FIG. 15 indicates that the lithography loads of the products 3 and 4 are lower than the lithography loads of the products 1 and 2. FIG. 16 shows the calculation of the overall mask manufacturing load index MMI including the defect guarantee load index DAT and a lithography load index EBI. This mask manufacturing load index MMI can be used to perform the relative comparison of the mask manufacturing difficulty level by product or by mask (layout). That is, the mask ordering party calculates the mask manufacturing load index MMI as described above and includes the step to transmit MMI to the mask manufacturer in a routine processing of the mask manufacturing step so that the difference of the manufacturing difficulty level by product or by mask layer can be quantitatively recognized for effective use in set up control of the mask manufacturing step.

While the defect guarantee load index, the lithography load index, and the mask manufacturing load index were compared between the mask layouts of different products in the example of FIG. 14 to FIG. 16, a standard value (reference value) set up in advance for each index can be compared to quantitatively recognize the difference of the manufacturing difficulty level.

Embodiment 6

The mask manufacturing load prediction system that calculates the mask manufacturing load index MMI for expressing the mask manufacturing difficulty level described in Embodiments 1 to 5 includes: (a) a select function of an image correction pattern used in a mask database inspection; (b) a setting function of no inspection area; (c) a function to provide a mask manufacturer with the predicted number of Shots by mask in advance; (d) an analyzing function of a mask layout that can be a factor to raise the mask manufacturing difficulty level; (e) a data transfer system function regarding the counting of the mask manufacturing difficulty level; and (f) a user interface function.

With the function (a), when performing image collation (Die-to-Database inspection) with the database in the mask inspection by using information, which is extracted by MRC, on a location of a pattern with high possibility of pseudodefects, the actual location of the pattern on the mask used for the image correction of the pattern of the database is selected. With a method to select a pattern for correction in which the layout is checked with a viewer in a preparatory step before the inspection step, and an operator experientially selects characteristic patterns that exist in the mask layout, the correction pattern must be selected again to perform an inspection again when pseudodefects are generated. On the other hand, with the mask manufacturing load prediction system according to the present embodiment, from the location of the pattern with a possibility of pseudodefects which is extracted by MRC, the part capable of including the largest number of patterns for the area size used for performing image correction with the mask inspection device can be automatically selected without positional deviation on the mask.

With the function (b), although the pattern with a possibility of pseudodefects is selected by MRC in the same manner as the function (a), from the location where the layout corresponding to the shape and the dimensions of a layout that will certainly have a pseudodefect, the area that should be excluded from the inspection region can be automatically set up.

With the function (c), the information on the number of Shots simulated by chip (the total number of Shots per chip, and the density distribution of the number of Shots in the chip) can be recounted for the overall mask. The total number of Shots and the density distribution of the number of Shots in the overall mask are generated based on the number of chips arranged, the position, positional relation of the chip body and a scribe portion, and the number of Shots of each chip. The mask manufacturer can recognize the mask manufacturing load and attentions that must be paid in manufacturing, thereby manufacturing masks more efficiently by knowing in advance the Shot number information (parameter used for manufacturing of photomasks) in addition to the calculated value of the mask manufacturing load index MMI.

With the function (d), after a rule for extracting the patterns that can be a mask manufacturing load is set, and after the pattern that may be a mask manufacturing load is extracted by MRC, a sample layout is selected using the mask manufacturing load prediction system according to the present embodiment so that a layout image is automatically trimmed and reported. In addition, as a part of the manufacturability test of a library cell layout, the mask manufacturing difficulty level can be judged per cell by using the mask manufacturing load prediction system. With the mask manufacturing load prediction system according to the present embodiment, the Shot number counting simulation per cell can be executed with using the data for layout evaluation of the library cell, and then the obtained result can be counted. A plurality of the same library cells located at random in the layout for evaluation are recognized as different cells after OPC processing under the influence of other cells adjacently located therearound. The number of Shots is calculated for each cell to finally count the number of Shots of the layout after OPC by cell before OPC. In addition, by calculating the number of Shots using the layout before OPC, cells that will have the number of Shots to be increased by OPC processing can be specified, thereby investigating causes of the increase of the mask lithography load.

With the above function (e), an MRC error file used when inputting the counting of the mask manufacturing difficulty level, a result file of the Shot number counting simulation, a GDS file, specifications (including materials), an electronic file (Photomask ordering information (the file can be divided into a plurality of electronic files)) including chip arrangement (the number and layout), a design node, a product classification, manufacturing steps, and delivery date setting etc. are respectively generated into electronic files and then, transmitted to a server comprising the mask manufacturing load prediction system individually or together from an MRC tool, the Shot number counting simulator, a CAD server of the mask ordering party, a mask ordering information server, etc. In this case, while there will be no restriction of a route of, for example, having another server on the way, each electronic file can be protected with a password determined between the mask ordering party and the mask manufacturer including when storing on the server. The server that controls the mask manufacturing load prediction system according to the present embodiment automatically executes a command to start the mask manufacturing load prediction system when necessary input files are prepared. In this process, an execution file with execution conditions indicated can also be automatically generated. The output of the mask manufacturing load prediction system is outputted in the form of files calculated for the above-mentioned purposes with the above-mentioned methods, and stored in a management server when outputted. At the same time, necessary output information is automatically transmitted to the mask manufacturer and the mask user (mask ordering party). This transmission process can be performed before, or after ordering the mask. The information transmitted to the mask manufacturer and the mask user can be in the form of an output file that is further arranged and processed after outputted from the mask manufacturing load prediction system.

With the function (f), the user interface with the mask manufacturing load prediction system is used when manually counting the mask manufacturing difficulty level. On the input screen of this user interface, at least one of the followings can be inputted: a name of an electronic file with MRC errors indicated; a name of an electronic file with a result of the Shot number counting simulation indicated; a name of an electronic file with specifications, (the number of) chip arrangements, a design node, the product classification, delivery date setting, etc. indicated; and a name of an electronic file etc. with calculation conditions for the mask manufacturing load prediction system indicated. A manual input is also possible. In addition, an input filename can be automatically displayed based on a serial number etc. of CAD processing. This user interface includes a selection field of a command to be executed, a button to specify, or an input field, as well as a setting field for names of output files including the mask manufacturing difficulty level calculation, the selection of the mask inspection reference pattern, setting of no inspection area and other output filenames. A setting in which output file names are automatically derived from input filenames can be used. A condition file for counting the mask manufacturing difficulty level includes coefficients such as a coefficient set for each MRC error rule in order to calculate a defect inspection load, a coefficient set for the number of Shots in order to calculate the lithography load, and a coefficient set for each layout divided by the design indent.

Embodiment 7

An estimation of a mask manufacturing difficulty level using a mask manufacturing load prediction system according to the present embodiment can quantitatively verify a reduction effect of the mask manufacturing difficulty level when using the DFM method.

For example, when a layout correction for arranging a top position of a pattern after OPC processing is performed so that Shot division is efficiently performed by mask electron beam lithography to obtain about a 10% decrease in the number of Shots, a mask manufacturing load index MMI decreases by about 2% compared with that before the layout correction, which indicates reduction of the mask manufacturing load.

Further, for example, if more detailed information on a design intent is introduced to a mask layout so that a pattern area having a defect guarantee specification equivalent to a dummy wiring 16D (refer to FIG. 5) formed by the CMP method is increased by about 10%, the reduction rate of the mask manufacturing load index MMI is about 1%. The proportion of the pattern having a relatively low priority in a mask layout differs by product. When, in a metallic wiring etc. of a first layer in a chip with a high manufacturing difficulty level, a pattern formed in the critical step such as a signal line and a pattern that needs lower accuracy as compared with the pattern formed in the critical step such as a power source line and a ground line (these patterns have slightly larger design dimensions and higher tolerance over pattern fluctuation) are distinguished, and the load for defect guarantee can be decreased with a pattern capable of lowering required accuracy compared with a pattern formed in the critical step by easing the defect standard and the restriction for a defect correction method and a verification method, the greater area ratios of the pattern capable of lowering required accuracy, the larger reduction effect of the mask manufacturing difficulty level can be obtained.

Embodiment 8

Design intent in the present embodiment means a priority classification of layout according to a designer's intention, and this information can be incorporated in mask layout data to be used for mask manufacturing. For example, the information is used for operation of the mask defect standard set depending on the priority of patterns, including: (a) different inspection sensitivity according to the priority; (b) differentiation of the determination of a defect after detection; (c) differentiation of correction of a detected defect and an inspecting method and standard after correction; and (d) different defect correction steps (methods) according to the priority information. The design intent can be used to ease the defect standard of a portion with a relatively low priority of a pattern, and relatively reduce the load of the defect inspection and the defect correction. In addition, according to the factor (d), the defect correction step can be changed to a step (method) easy and having a lower risk, thereby achieving reduction of defect correction time and reduction of defect correction failures as a result.

Further, since the load on mask manufacturing differs according to the priority of a pattern, the load of the actual defect guarantee step of the whole chip (or mask) can be predicted by calculating the area of a pattern and an area assigned to each priority, and by expressing an effect of adjusting the mask defect standard etc. by priority with relative weighting. An effective inspection area is calculated with the following formula based on this idea. That is, the effective inspection area EIA can be calculated with a formula expressed by $EIA = b1 \times S1 + b2 \times S2 + \ldots$, where $S1, S2, \ldots$ are sums of the areas of patterns or areas having the priorities 1, 2, ... given by the design intent, and $b1, b2, \ldots$ are coefficients to expresses the respective weightings. The effective inspection area EIA influences the defect correction step in the defect guarantee, and the defect guarantee load index DAT that determines the mask manufacturing load index MMI described in Embodiment 1. That is, the mask manufacturing load index MMI indicating the mask manufacturing load can be predicted from the effective inspection area EIA.

According to the above-described present embodiment, in the same manner as Embodiment 1, the mask manufacturing load index MMI can be calculated by mask layout with the mask manufacturing load prediction system before transmission of mask ordering data, and mask manufacturing can be performed easily by checking the mask manufacturing load index MMI in advance at the developmental stage etc. Therefore, the efficiency of mask manufacturing can be improved. In addition, the improved efficiency of mask manufacturing reduces the manufacturing cost of the mask, resulting in the reduced cost of the mask itself.

Embodiment 9

The mask manufacturing load prediction system that calculates the mask manufacturing load index MMI for expressing the mask manufacturing difficulty level described in Embodiments 1 to 5 includes: (a) a select function of an image correction pattern used in a mask database inspection; (b) a setting function of no inspection area; (c) a function to provide a mask manufacturer with the predicted number of Shots by mask in advance; (d) an analyzing function of a mask layout that can be a factor to raise the mask manufacturing difficulty level; (e) a data transfer system function regarding the counting of the mask manufacturing difficulty level; and (f) a user interface function.

With the function (a), when performing image collation (Die-to-Database inspection) with the database in the mask inspection by using information, which is extracted by MRC, on a location of a pattern with high possibility of pseudodefects (problematic pattern), the actual location of the pattern on the mask used for the image correction of the pattern of the database is selected. With a method to select a pattern for correction in which the layout is checked with a viewer in a preparatory step before the inspection step, and an operator experientially selects characteristic patterns that exist in the mask layout, the correction pattern must be selected again to perform an inspection again when pseudodefects are generated. On the other hand, with the mask manufacturing load prediction system according to the present embodiment, from the location of the pattern with a possibility of pseudodefects which is extracted by MRC, the part capable of including the largest number of patterns for the area size used for performing image correction with the mask inspection device can be automatically selected without positional deviation on the mask. Further, by using the pattern with high possibility of pseudodefects as a correction processing pattern of the defect inspection device, the number of pseudodefects can be reduced and the defect review time after the defect inspection on the mask can be reduced. Accordingly, in the defect inspection process, it becomes possible to avoid the problem of generating many pseudodefects. Moreover, also by defining part of patterns among the pattern with high possibility of pseudodefects as no inspection areas so as not to perform defect inspection, the number of defects can be reduced and the defect review time after the defect inspection on the mask.

With the function (b), although the pattern with a possibility of pseudodefects is selected by MRC in the same manner as the function (a), from the location where the layout corresponding to the shape and the dimensions of a layout that will certainly have a pseudodefect, the area that should be excluded from the inspection region can be automatically set up.

With the function (c), the information on the number of Shots simulated by chip (the total number of Shots per chip, and the density distribution of the number of Shots in the chip) can be recounted for the overall mask. The total number of Shots and the density distribution of the number of Shots in the overall mask are generated based on the number of chips arranged, the position, positional relation of the chip body and a scribe portion, and the number of Shots of each chip. At this time, in the case where these data of the total number of Shots and Shot number density distribution excess a limitation of the memory mounted in the lithography device to be used (desired), another lithography device having a memory with larger capacitance mounted thereto is selected so as not to exceed the limitation of the memory. Further, in the case where the Shot number density distribution becomes locally high and exceeds the limitation of the memory mounted to the lithography device to be used, photomask lithography data having a smaller size of data to be processed in one time so as to make the size within the allowable size of the memory mounted to the lithography device. As a result, the mask manufacturer can recognize the mask manufacturing load and attentions that must be paid in manufacturing, thereby manufacturing masks more efficiently by knowing in advance the Shot number information (parameter used for manufacturing of photomasks) in addition to the calculated value of the mask manufacturing load index MMI. Further, since it is possible to prevent the size of the data sent to the lithography device from exceeding the capacity of the memory mounted in the lithography device, the problem of lithography failure (abort) due to memory capacity shortage can be prevented in the lithography process, thereby performing the lithography process to the end normally.

With the function (d), after a rule for extracting the patterns that can be a mask manufacturing load is set, and after the pattern that may be a mask manufacturing load is extracted by MRC, a sample layout is selected using the mask manufacturing load prediction system according to the present embodiment so that a layout image is automatically trimmed and reported. In addition, as a part of the manufacturability test of a library cell layout, the mask manufacturing difficulty level can be judged per cell by using the mask manufacturing load prediction system. With the mask manufacturing load prediction system according to the present embodiment, the Shot number counting simulation per cell can be executed with using the data for layout evaluation of the library cell, and then the obtained result can be counted. A plurality of the same library cells located at random in the layout for evaluation are recognized as different cells after OPC processing under the influence of other cells adjacently located therearound. The number of Shots is calculated for each cell to finally count the number of Shots of the layout after OPC by cell before OPC. In addition, by calculating the number of Shots using the layout before OPC, cells that will have the number of Shots to be increased by OPC processing can be specified, thereby investigating causes of the increase of the mask lithography load.

With the above function (e), an MRC error file used when inputting the counting of the mask manufacturing difficulty level, a result file of the Shot number counting simulation, a GDS file, specifications (including materials), an electronic file (Photomask ordering information (the file can be divided into a plurality of electronic files)) including chip arrangement (the number and layout), a design node, a product classification, manufacturing steps, and delivery date setting etc. are respectively generated into electronic files and then, transmitted to a server comprising the mask manufacturing load prediction system individually or together from an MRC tool, the Shot number counting simulator, a CAD server of the mask ordering party, a mask ordering information server, etc. In this case, while there will be no restriction of a route of, for example, having another server on the way, each electronic file can be protected with a password determined between the mask ordering party and the mask manufacturer including when storing on the server. The server that controls the mask manufacturing load prediction system according to the present embodiment automatically executes a command to start the mask manufacturing load prediction system when necessary input files are prepared. In this process, an execution file with execution conditions indicated can also be automatically generated. The output of the mask manufacturing load prediction system is outputted in the form of files calculated for the above-mentioned purposes with the above-mentioned methods, and stored in a management server when outputted. At the same time, necessary output information is automatically transmitted to the mask manufacturer and the mask user (mask ordering party). This transmission process can be performed before, or after ordering the mask. The information transmitted to the mask manufacturer and the mask user can be in the form of an output file that is further arranged and processed after outputted from the mask manufacturing load prediction system.

With the function (f), the user interface with the mask manufacturing load prediction system is used when manually counting the mask manufacturing difficulty level. On the input screen of this user interface, at least one of the followings can be inputted: a name of an electronic file with MRC errors indicated; a name of an electronic file with a result of the Shot number counting simulation indicated; a name of an electronic file with specifications, (the number of) chip arrangements, a design node, the product classification, delivery date setting, etc. indicated; and a name of an electronic file etc. with calculation conditions for the mask manufacturing load prediction system indicated. A manual input is also possible. In addition, an input filename can be automatically displayed based on a serial number etc. of CAD processing. This user interface includes a selection field of a command to be executed, a button to specify, or an input field, as well as a setting field for names of output files including the mask manufacturing difficulty level calculation, the selection of the mask inspection reference pattern, setting of no inspection area and other output filenames. A setting in which output file names are automatically derived from input filenames can be used. A condition file for counting the mask manufacturing difficulty level includes coefficients such as a coefficient set for each MRC error rule in order to calculate a defect inspection load, a coefficient set for the number of Shots in order to calculate the lithography load, and a coefficient set for each layout divided by the design indent.

In the foregoing, the invention made by the inventors of the present invention has been concretely described based on the embodiments. However, it is needless to say that the present invention is not limited to the foregoing embodiments and various modifications and alterations can be made within the scope of the present invention.

The method of manufacturing a photomask according to the present invention is applicable to a manufacturing process of a photomask from ordering to manufacturing of various photomasks.

What is claimed is:

1. A method of manufacturing a photomask comprising the steps of:
    (a) calculating a photomask manufacturing load index based on a photomask manufacturing difficulty level;
    (b) manufacturing the photomask by: a lithography step performed by a photomask lithography device; a defect inspection step performed by a defect inspection device; and
    a defect correction step performed by a defect correction device, wherein
    the step (a) comprises a step of
    (a1) analyzing a mask layout,
    the photomask manufacturing load index includes at least one of a defect guarantee load index and a lithography load index,
    the defect guarantee load index is a first function to be determined based on: a number of errors as the number of patterns to be problematic in the photomask manufacturing extracted in the step (a1); and a priority of patterns arranged in the mask layout,
    the lithography load index is a second function to be determined based on: a total number of Shots per a semiconductor chip, where a unit of lithography of the photomask lithography device is defined as a Shot; and an area of the semiconductor chip, and
    in the step (a1), the mask layout is analyzed based on an analysis previously set so that the patterns to be problematic in the photomask manufacturing are extracted, and further the total number of Shots per the semiconductor chip is computed,
    wherein information of the patterns to be problematic in the photomask manufacturing is analyzed so that a density distribution of the Shots is computed, and when the density of the Shot is high and exceeds a memory limit in the desired photomask lithography device, another photomask lithography device is selected so as not to exceed the memory limit.

2. A method of manufacturing a photomask comprising the steps of:
    (a) calculating a photomask manufacturing load index based on a photomask manufacturing difficulty level;
    (b) manufacturing the photomask by: a lithography step performed by a photomask lithography device; a defect inspection step performed by a defect inspection device; and a defect correction step performed by a defect correction device, wherein
    the step (a) comprises a step of
    (a1) analyzing a mask layout,
    the photomask manufacturing load index includes at least one of a defect guarantee load index and a lithography load index,
    the defect guarantee load index is a first function to be determined based on: a number of errors as the number of patterns to be problematic in the photomask manufacturing extracted in the step (a1); and a priority of patterns arranged in the mask layout,
    the lithography load index is a second function to be determined based on: a total number of Shots per a semiconductor chip, where a unit of lithography of the photomask lithography device is defined as a Shot; and an area of the semiconductor chip, and
    in the step (a1), the mask layout is analyzed based on an analysis previously set so that the patterns to be problematic in the photomask manufacturing are extracted, and further the total number of Shots per the semiconductor chip is computed,
    wherein the patterns to be problematic in the photomask manufacturing are analyzed so that a density distribution of the Shots is computed, and when the density of the Shot is locally high and exceeds a memory limit in the desired photomask lithography device, a photomask lithography data having a small data size to be processed in one time is prepared so as to be within an allowable memory size of the desired photomask lithography device.

* * * * *